United States Patent [19]
Jabr

[11] Patent Number: 5,594,748
[45] Date of Patent: Jan. 14, 1997

[54] METHOD AND APPARATUS FOR PREDICTING SEMICONDUCTOR LASER FAILURE

[75] Inventor: Salim N. Jabr, Mountain View, Calif.

[73] Assignee: Telephone Information Systems, Inc., Mountain View, Calif.

[21] Appl. No.: 513,361

[22] Filed: Aug. 10, 1995

[51] Int. Cl.$^6$ .................................................. H01S 3/00
[52] U.S. Cl. ................................................. 372/38; 372/6
[58] Field of Search .............................. 372/38, 6, 29–32

[56] References Cited

U.S. PATENT DOCUMENTS

| | | | |
|---|---|---|---|
| 4,955,025 | 9/1990 | Mears et al. | 372/6 |
| 5,101,461 | 3/1992 | Nakajima | 372/6 |
| 5,173,957 | 12/1992 | Bergano et al. | 372/30 |
| 5,260,823 | 11/1993 | Payne et al. | 372/6 |
| 5,297,154 | 3/1994 | Heidemann et al. | 372/6 |

OTHER PUBLICATIONS

G. Grasso, et al., Field Reliability of 980nm Fiber Amplifiers, (Aug. 1994) Conference on: Optical Amplifiers & Their Application, Breckenridge, Colorado, pp. PD5–1 to PD5–3.

Bellcore Research Lab., 331 Newman Springs Road, Red Bank, NJ, Special Procedures and Test Methods for Lasers, TR–NWT–000468, Issue 1, Dec. 1991, pp. 50–72.

*Primary Examiner*—Leon Scott, Jr.
*Attorney, Agent, or Firm*—Flehr, Hohbach, Test, Albritton & Herbert

[57] ABSTRACT

A method and apparatus are disclosed for predicting the failure of semiconductor lasers. To predict the failure of a particular semiconductor laser, operational characteristics that are predictive of a laser's health are computed while the laser is in use (e.g., while the laser is transmitting a signal or pumping an optical amplifier or solid state laser). This is done by modulating the injection current of the semiconductor laser and observing changes in laser parameters such as output power and junction voltage. From these observations, various laser characteristics can be computed including current threshold, slope efficiency and dynamic resistance. By carefully selecting the injection current modulation frequency and degree, the system in which the laser is used is not significantly disturbed by the changes in output power. For example, modulating the injection current with a modulation period that is substantially less than the relaxation time of the dopant ions in a solid-state laser does not substantially affect the gain of the solid state laser. The current modulation and laser parameter sampling are controlled by a microprocessor via a controller interface. During any particular modulation cycle, the microprocessor stores multiple parameter samples in a random access memory. Once enough samples have been stored, the microprocessor computes the laser characteristics and compares them to beginning-of-life data for the same semiconductor laser, which are stored in a read only memory. If the laser characteristics are out of range with respect to the beginning-of-life data, the microprocessor outputs an alarm via a serial interface.

21 Claims, 10 Drawing Sheets

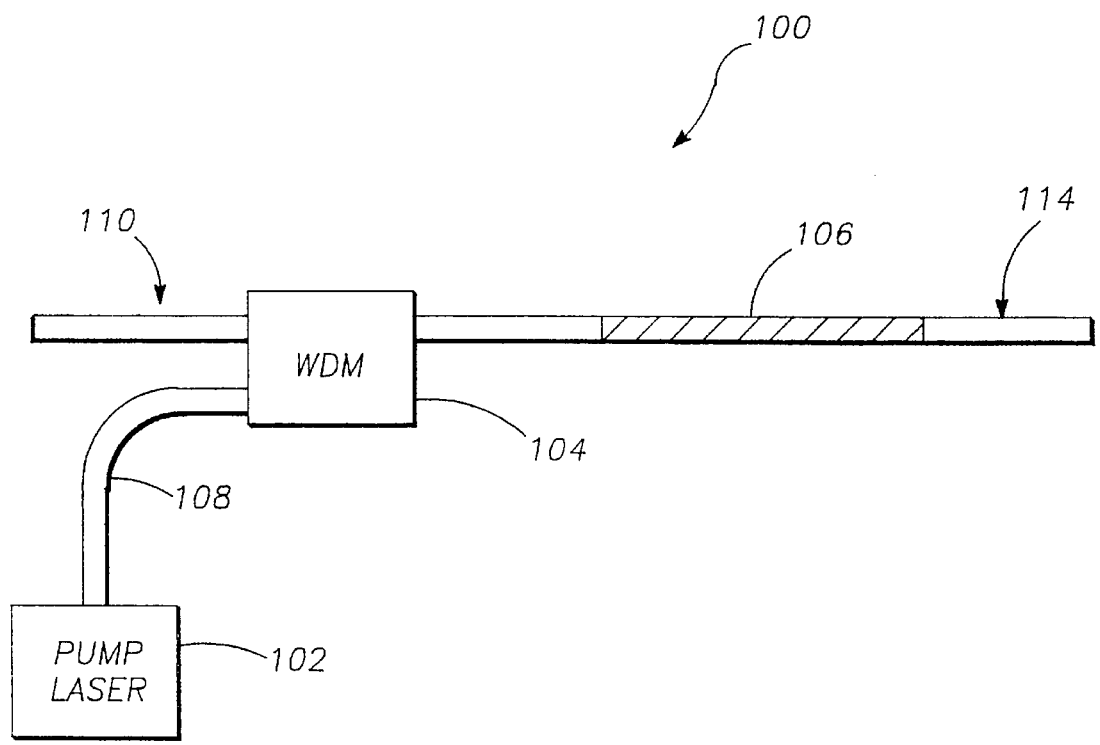
FIG.—1   OPTICAL FIBER AMPLIFIER
PRIOR ART

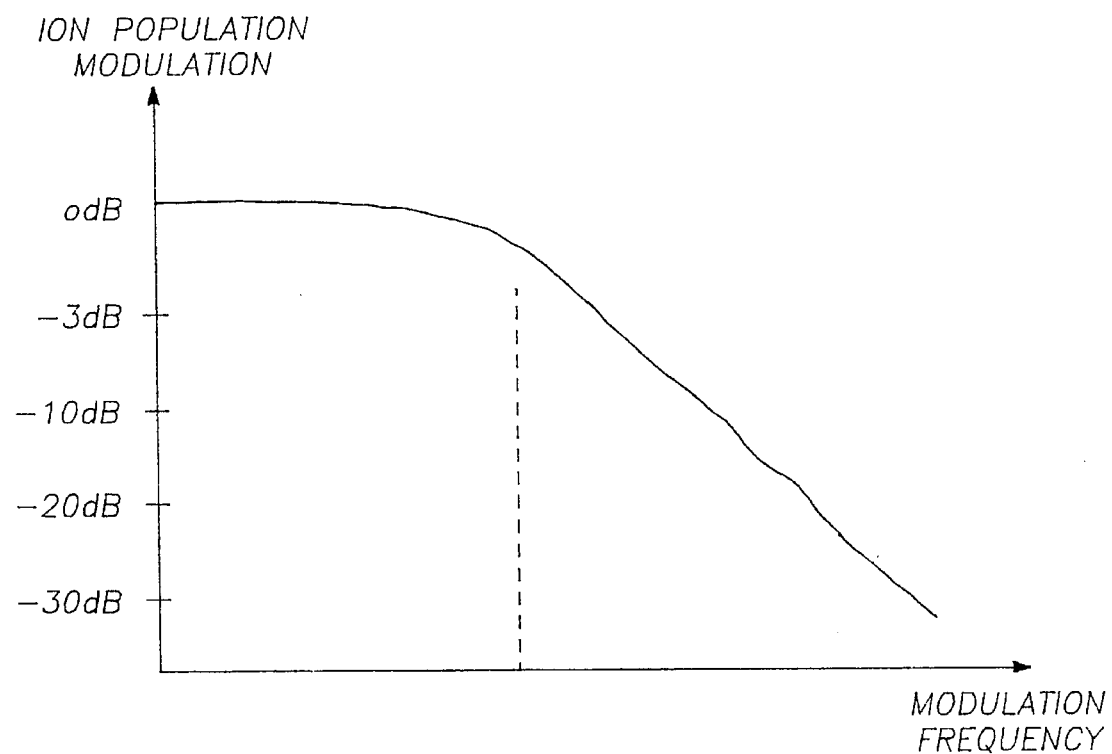
FIG.—2B

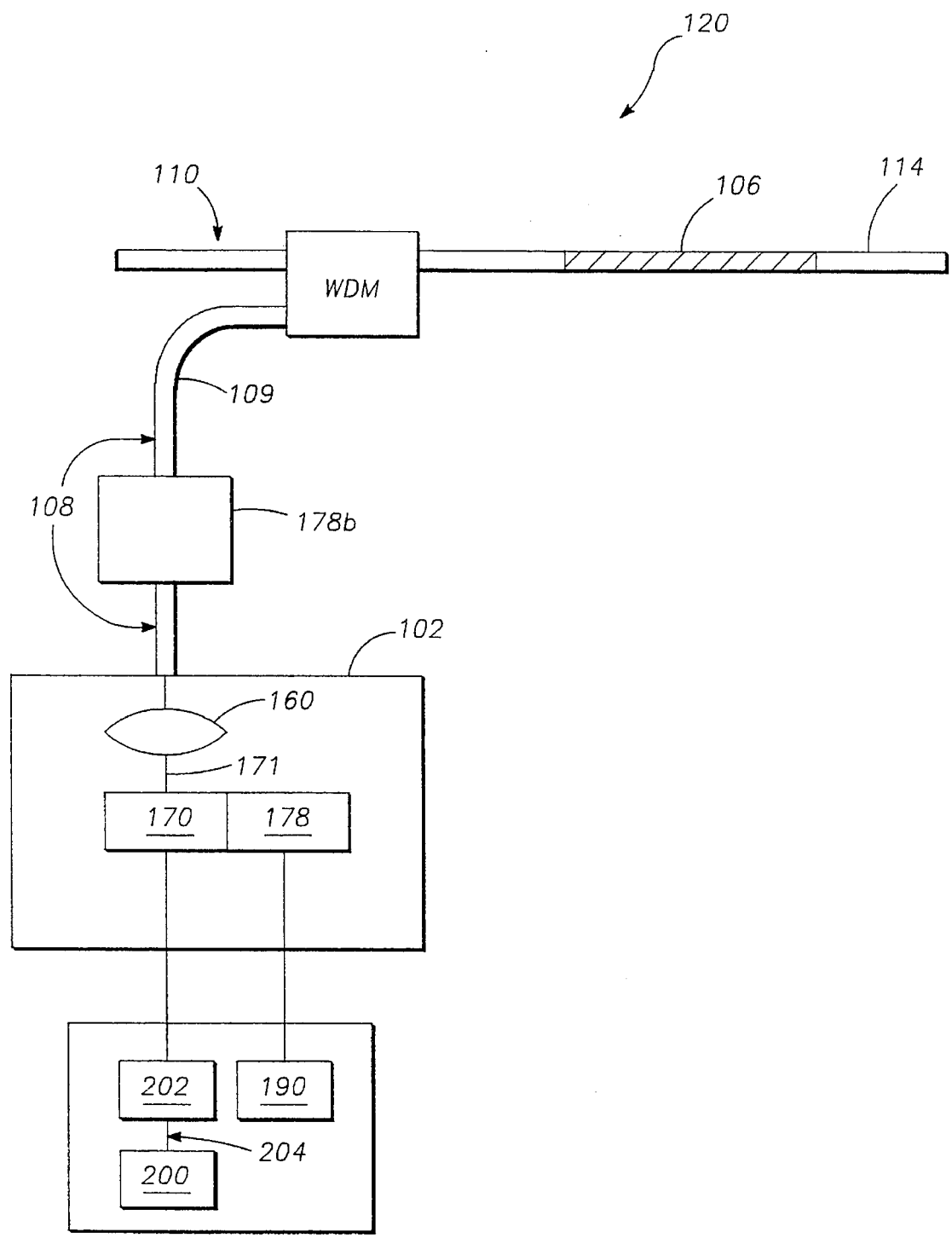
FIG.—4

METHOD AND APPARATUS FOR PREDICTING SEMICONDUCTOR LASER FAILURE

This invention pertains to high power semiconductor lasers. More specifically this invention provides a method of measuring critical semiconductor laser characteristics without interrupting their operation.

DESCRIPTION OF THE PRIOR ART

A large number of applications utilize solid state lasers and amplifiers to generate or amplify light at specific wavelengths. Examples of such applications include the medical treatment of glaucoma by laser, surgery utilizing laser cutting and cauterizing of tissue, industrial metal treatment and welding using lasers and the amplification of light in a fiber communication system.

Solid state lasers generally contain a lasing element such as a rare earth or other atomic constituent in a glass or crystal matrix. The matrix can be in the form of a plate, a rod or an optical fiber. The fiber form is advantageous because it maintains the concentration of the light energy in a small area of the matrix and thus increases the power density. Traditionally solid state lasers require a light source at a preferred wavelength to excite the lasing element in the glass or crystal. Discharge lamps and flash lamps have been used in the past to pump such solid state lasers. More recently semiconductor lasers whose wavelength matches more closely the absorption band of the lasing element have been used to excite or pump the lasing elements. For example, Indium Gallium Arsenide lasers emitting at a wavelength of 780 nm are used to pump Neodymium YAG (yttrium aluminum garnet) solid state lasers.

Another type of solid state device using semiconductor pump lasers is the doped fiber laser or light amplifier 100 shown in FIG. 1. Light amplifiers of this type are well-known and consist of at least one pump laser 102, a wavelength-division multiplexer ("WDM") 104, and a section of active fiber 106 whose core area is doped with rare earth ions. The WDM 104 multiplexes the pump laser signal 108 and the light signal to be amplified 110 and outputs the multiplexed signal 112 to the active fiber 106. Using the power in the multiplexed signal 112 contributed by the pump laser 102, the active fiber 106 outputs an amplified version 114 of the light signal 110.

It is well known in the art that the lifetime of the semiconductor lasers is shorter, at the high powers required to pump the solid state lasers, than the lifetimes required by the systems applications in which they are employed. For example, in telecommunications applications, a light amplifier's mean time to failure is required to be longer than twenty years. The pump lasers in such a light amplifier however have a mean time to failure that is much shorter. When a pump laser fails, the operation of the whole communications system is impaired and high revenue losses are incurred. Consequently, there is much interest in the telecommunications industry in predicting when pump lasers will fail and then replacing them before that failure occurs.

Traditionally, these predictions have been based on special tests known as accelerated life tests which are conducted in order to obtain a statistical measure of the longevity of pump lasers. The drawbacks of such tests are that they provide only probabilities of failure and cannot point to or predict the failure of any given device in a system containing a large number of devices. Furthermore the accelerated life test is predicated on the assumption that the failure rate or mean time of failure scales with temperature and power according to some specific model selected from a large number of such models, the accuracies of which are still being tested.

There is therefore a need for a non-statistical method for predicting the failure of high power semiconductor lasers in failure sensitive applications and systems without disrupting the operation of those systems.

SUMMARY OF THE INVENTION.

In summary, the present invention is method and apparatus that meets the needs set out above. Specifically, the present invention is a method and apparatus for non-disruptive measurement of a semiconductor laser's status and parameters such as threshold current and efficiency at periodic time intervals, and for utilizing this information to predict the impending failure of the semiconductor laser. The present invention can be applied to semiconductor lasers used to pump solid state lasers or amplifiers or to semiconductor lasers used as a sole light source. At the factory the light-current and current-voltage characteristics of a semiconductor laser are measured and stored in an electronic memory as "beginning-of-life" data. During operation of the laser a modulation is applied to the laser current and the ensuing variation of the light output of the laser is measured by a photodetector, digitized and compared to the beginning-of-life or other historical performance data. From the digitized record of the variation of laser output with laser current, the threshold current of the laser as well as the slope efficiency can be computed. From the record of the laser voltage as a function of the laser current, the dynamic resistance of the laser can be computed. The change in laser threshold, efficiency or dynamic resistance between periodic measurements is employed to predict the failure of the laser. The beginning-of-life threshold and dynamic resistance can also be compared to the latest measurements for reference.

In the case of a fiber amplifier pump laser, the output of the semiconductor laser is coupled into a fiber. The overall efficiency of such a fiber coupled laser is the sum of the laser efficiency and fiber coupling efficiency. The coupling efficiency may change with aging of the laser package resulting in a change in the observed overall efficiency. Such a change is not indicative of degradation at the laser chip level. A change in the threshold current to the laser or in the dynamic resistance is however indicative of chip degradation. Thus, by detecting a change in threshold current to the laser or in the dynamic resistance, the present invention can discriminate between degraded coupling efficiency and chip degradation, allowing failing semiconductor pump lasers to be replaced but not the merely inefficient ones.

DETAILED DESCRIPTION OF THE DRAWINGS

FIG. 1 is a block diagram of a prior art light amplifier consisting of a pump laser, a wavelength-division multiplexer and a length of active fiber.

FIG. 2b is a graph of Erbium ion population modulation in the active fiber from FIG. 1 as a function of modulation frequency.

FIG. 4 is an expanded block diagram of the pump laser of the present invention.

DETAILED DESCRIPTION OF THE PREFERRED EMBODIMENT

Figure 2A:
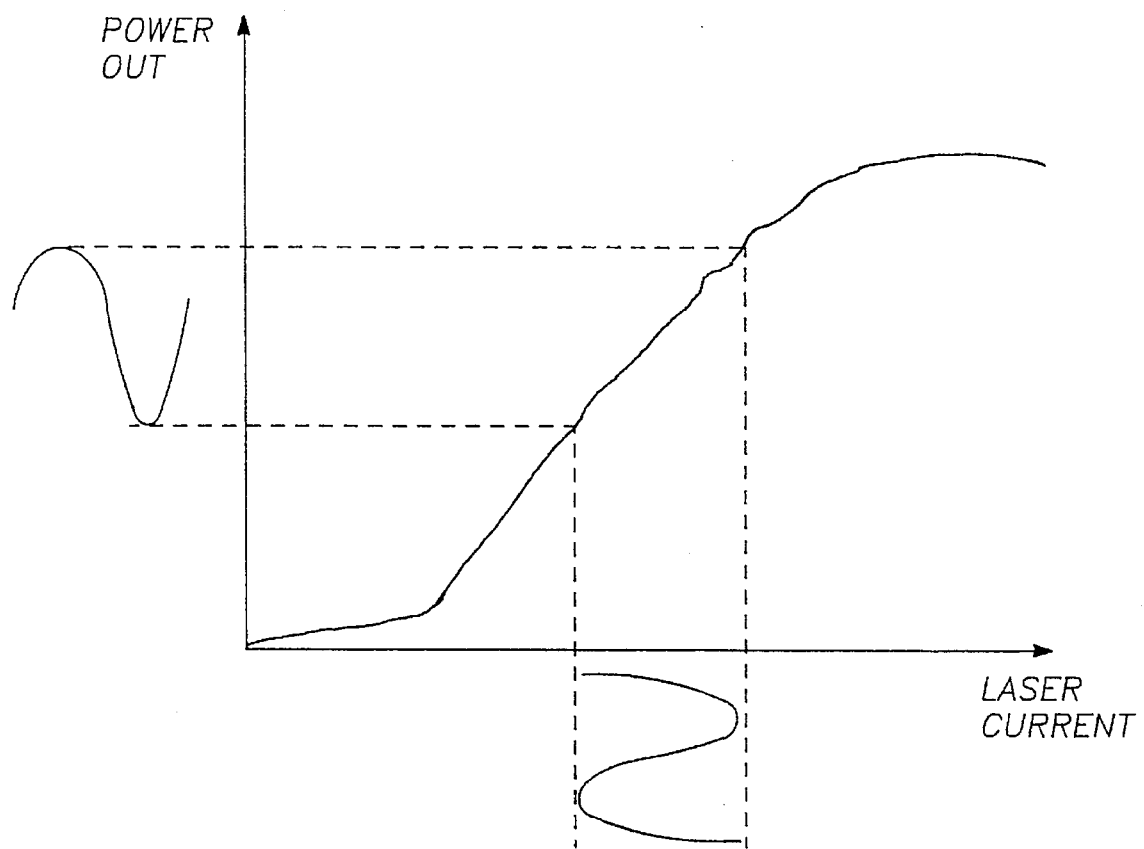
FIG. 2a is a graph of the light output versus injection current of a semiconductor laser, showing a modulation in the injection current and resulting modulation in output light power.

Referring again to FIG. 1, in a doped fiber amplifier 100 the signal carrying light (@ 1550 nm) 110 is combined with the light 108 from a pump laser (980 or 1480 nm) 102 into a fiber 106 containing traces (10 to 1000 ppm) of a rare earth ion in its core area. The combining is done using a wavelength selective coupler also known as a wavelength-division multiplexer (WDM) 104. The pump light 108 excites the Erbium ("Er") (or other dopant such as Neodymium ("Nd") or Praseodymium) into a higher energy level which is metastable, i.e., has a long lifetime (10 ms in the case of Er, 100 microsec in the case of Nd). The presence of signal light 110 at the proper wavelength (1520 to 1570 nm in the case of Er, 1310 to 1340 in the case of Nd) causes the ions in the active fiber 106 to decay back to the ground energy level by emitting light coherently with the signal light. This process is known as Light Amplification by Stimulated Emission of Radiation (LASER). The gain of a fiber amplifier 100 is dependent on the difference in ion population between the excited state and ground state. This difference is in turn determined by the pump light intensity, the signal light intensity and the natural relaxation or decay time of the ion.

If the pump light 108 is modulated by a modulation fraction A (i.e., the percent deviation of the pump light power from an operational power level) at some modulation frequency F, the ion population difference will also be modulated and so will the gain of the amplifier and the power of the output signal 114. However, if the pump light modulation period 1/F is short in comparison to the relaxation time of the excited ion state of the active fiber 106, the power of the output signal 114 will vary only to a small extent. This is because, due to the long relaxation time of the excited ions with respect to the modulation period 1/F, the ion population will not have an opportunity to relax to an appreciable extent during low power phases of the pump light modulation cycles. In other words, when the modulation proceeds at high enough frequencies, the ion population modulation will have a small amplitude, which is reflected in the output 14. For an illustration of this phenomenon, see FIG. 2a, which shows the injection current being modulated with a modulation period P (or 1/F) that is much less than the relaxation time of the excited ions and FIG. 2b, which shows the modulation of the Erbium ions as a function of the modulation frequency F.

The present invention takes advantage of this fact to compute, while the fiber amplifier 100 is operating, characteristics of the semiconductor pump laser 102 that can predict the laser's imminent failure. How the present invention accomplishes this is described in depth below. Briefly, though, the present invention modulates the semiconductor laser's injection current with a modulation period that is at most ⅓ of the relaxation time of the excited ion state of the active fiber 106, which causes little change in the gain of the amplifier 100. For example, in the case of an Erbium-doped active fiber 106, in which the relaxation time is 10 ms, the laser current could be modulated at rates greater than 300 Hz, corresponding to a modulation period of less than 3.333 ms. More generally, the present invention can be used to compute the characteristics of semiconductor lasers in any application as long as the sensitivity of the application to output power variations (both amplitude and period) of the semiconductor laser is determined and the laser current modulated below that level of sensitivity. For example, in medical applications, semiconductor lasers are often used to provide continuous wave (CW) or pulsed signals which are used directly. A modulation can be superposed on top of these types of laser signals that will not interfere with the medical usefulness of the semiconductor laser's light while allowing the laser characteristics to be computed according to the present invention.

While modulating the laser injection current, the present invention measures corresponding changes in the laser's output light power (light power), injection current (current) and junction voltage (voltage). From these measurements, there are computed the laser's (1) current threshold (i.e., the current at which the semiconductor laser begins to emit light), (2) slope efficiency (the rate of change of light power as a function of current), and (3) the laser's dynamic resistance (rate of change of voltage divided by rate of change of current plotted as a function of current), all of which values are characteristic of the laser's health. These measured values are then compared to corresponding "beginning-of-life" data generated for the same laser unit at the factory for reference purposes and to predict failure of the pump laser 102. Alternatively, the measured values can be compared to other historical characteristic data computed for the semiconductor laser after the laser was manufactured. These other historical data could be measurements made by a systems integrator or those made according to the present invention while the laser is in operational use. For the purposes of this application, except where explicitly noted otherwise, any of these "earlier characteristic data" (meaning beginning-of-life data or other historical performance data) can be used for comparison and laser evaluation purposes.

Figure 3:
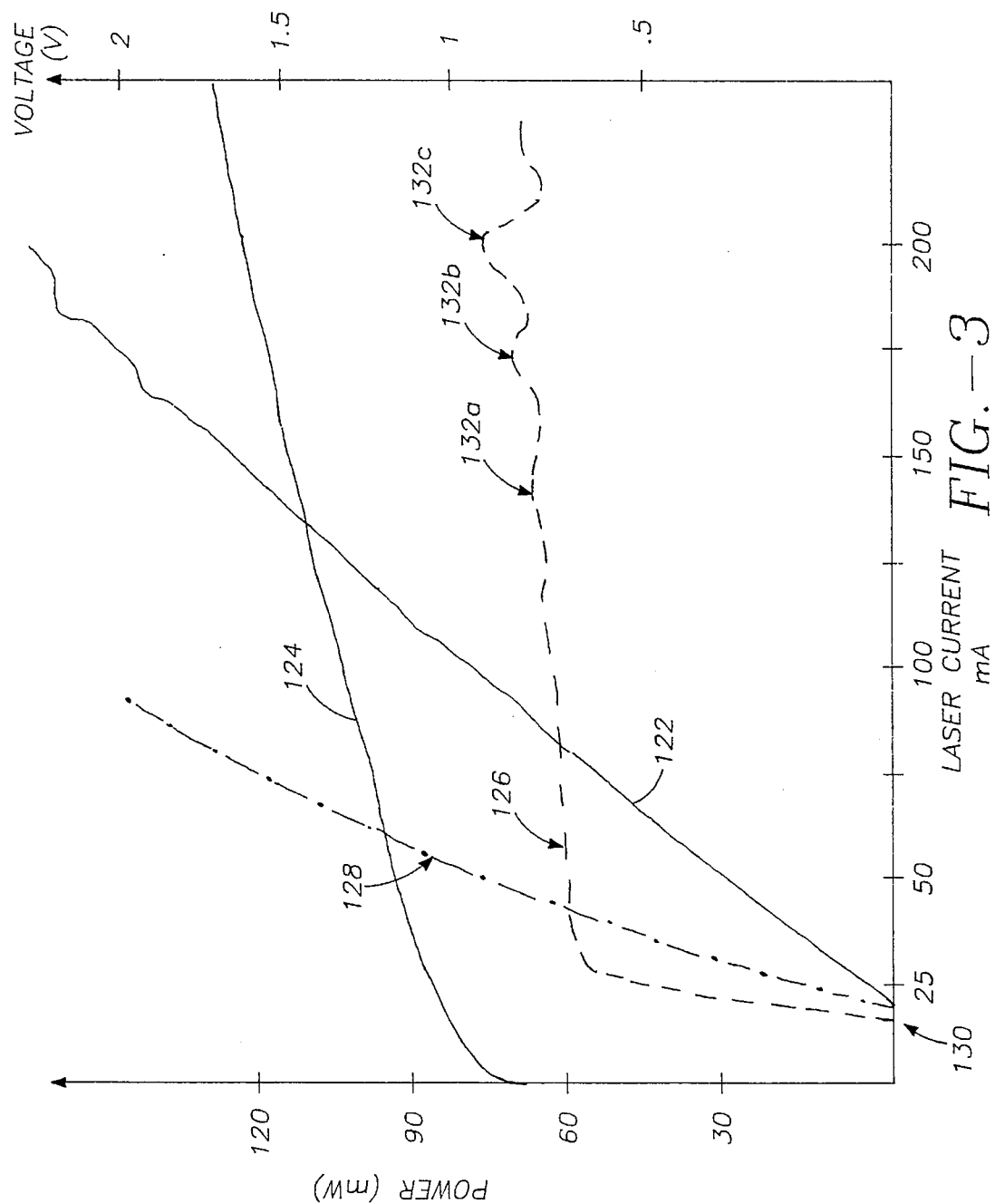
FIG. 3 is a graph of "beginning-of-life" characteristic curves for a semiconductor pump laser that operates at 980 nm.

For example, FIG. 3 shows a set of beginning-of-life data curves for a Lasertron 980 nm pump laser. These curves include a light power versus current curve 122, a voltage versus current curve 124, a slope efficiency curve 126 and a back facet power curve 128. The current threshold mentioned is easily obtained from the beginning-of-life data as the point 130 where the light-current curve 122 intersects the horizontal (current) axis.

The slope efficiency curve 126 shows the rate of change of the curve 122 as a function of current (i.e, the curve 126 is the derivative of the curve 122) and is the measure of how well the pump laser 102 turns current into light power. Ideally, the curve 126 would be completely flat, corresponding to a pump laser 102 with an absolutely linear light-current curve 122; however, as the light-current curve 122 is never completely linear, the curve 126 contains variations or deviations from linearity. Particularly large deviations of the curve 126, e.g., at the points 132a, 132b, 132c, are referred to as "kinks". The positions of these kinks are characteristics of a particular laser and are recorded in each laser's beginning-of-life data. Note that in better lasers, the kinks occur at higher currents (this is because such lasers can be operated at higher input currents and therefore generate higher power light signals).

The voltage-current curve 124, which is a plot of the laser junction voltage as a function of laser injection current, provides the information necessary to compute the dynamic resistance of the laser 102, which is obtained by taking the rate of change of voltage with current for a range of operating currents.

As the pump laser 102 represented by the beginning-of-life curves of FIG. 3 begins to fail, the current threshold 130, dynamic threshold for a given current, and location of the kinks 132a, 132b, 132c will change. Consequently, during the operational life of the pump laser 102, the present invention periodically modulates the laser current in a range that is appropriate for observing changes in these characteristics (e.g., in the preferred embodiment, the current is modulated between five and ten percent above and below the operational current level) and, when the changes become significant in comparison to the beginning-of-life data, sets an alarm to alert an operator that the pump laser 102 should be replaced.

Note that an impending failure cannot be predicted by simply monitoring the overall efficiency of the pump laser 102 as seen through the power current characteristics of the pump light 108. This is because overall laser efficiency is a combination of laser slope efficiency (i.e., the curve 126) and light coupling efficiency (not shown in FIG. 2), which is a measure of how well the light from the pump laser 102 is coupled into the fiber carrying the pump light 108. As the laser ages, this coupling might degrade, thus impairing overall efficiency without having any relevance to laser failure. In fact, degraded light coupling efficiency has no effect on the laser threshold 130. Thus, even in the presence of different levels of optical coupling efficiency, impending laser failure can still be predicted by computing the laser threshold from the light power-current characteristics.

Having set out the technological basis of the present invention, details of the apparatus and method of the preferred embodiment are now described.

System Block Diagram

Referring to FIG. 4, there is shown an expanded block diagram of an optical fiber amplifier 120 including the present invention. This diagram is quite similar to FIG. 1 except for the addition of the controller 200 and the controller interface 202, which are used in the present invention to control the pump laser 102. In the preferred embodiment, the controller 200 and controller interface 202 are mounted on a computer card 122 that is separate from the card on which the components of the pump laser 102 are mounted.

FIG. 4 also shows additional details of the pump laser 102, which commonly includes a laser chip 170 that generates a light beam 171, a lens 160 that couples the beam 171 into the light fiber 109 connected to the WDM 104 as the pump light 108 and a thermo-electric cooler (TEC) 178 that provides cooling for the laser chip 170. Also included in the card 122 is a thermal compensation circuit 190 that controls the temperature of the laser chip 170 via the TEC 178. During operation of the amplifier 120, data is exchanged between the pump laser 102 and the controller 200 via the controller interface 202, to which the controller 200 is connected by a conventional data bus 204. Using this two-way data flow, the laser controller 200 controls the pump current modulation of the laser chip 170, measures operational characteristics of the laser chip 170, and determines from those measurements the condition; i.e., the likelihood of failure, of the pump laser 102.

Figure 5A:
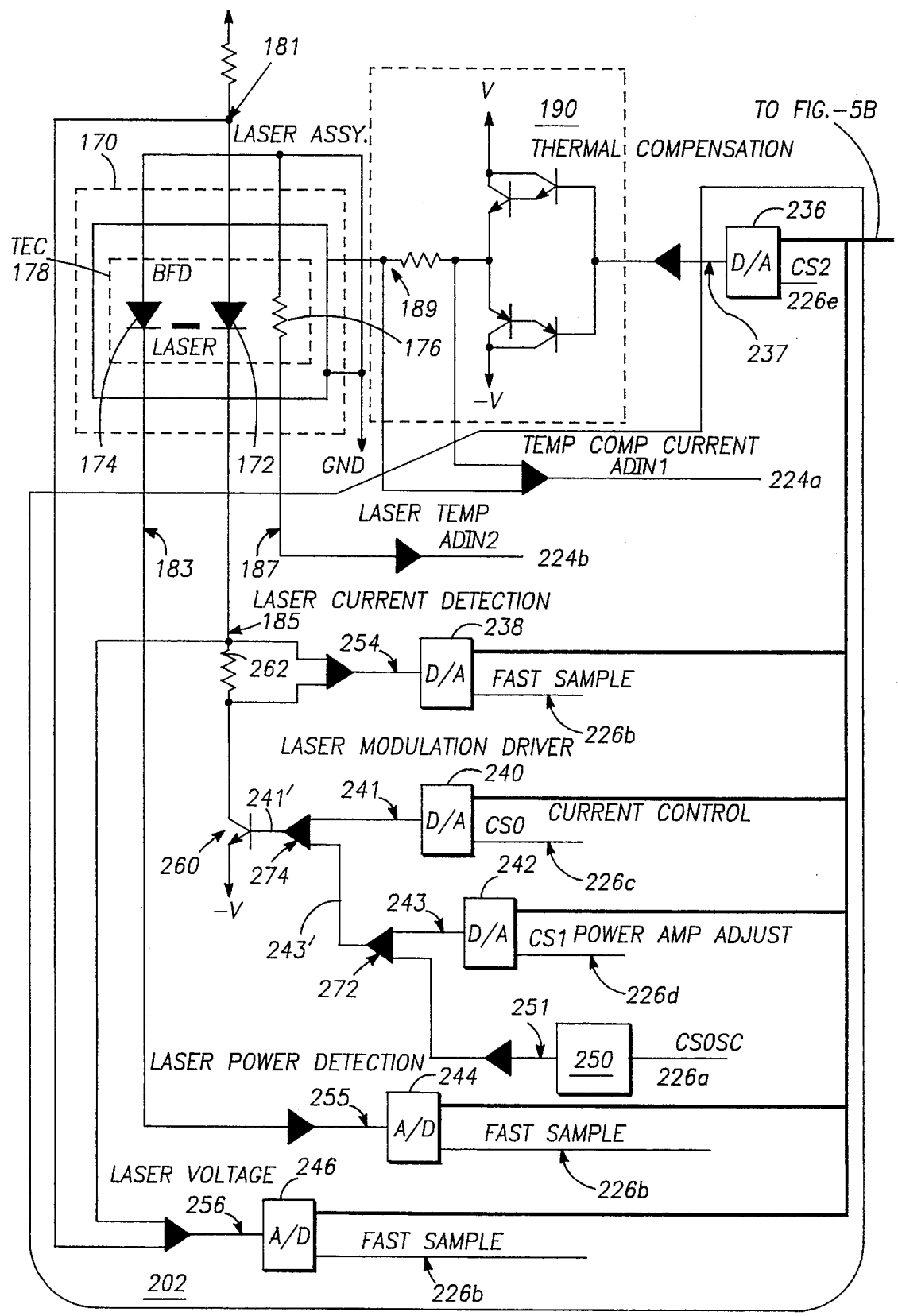
FIG. 5 is a schematic diagram of the preferred embodiment showing the laser, microprocessor, memory chips and associated electronics and modulation oscillator.
Figure 5B:
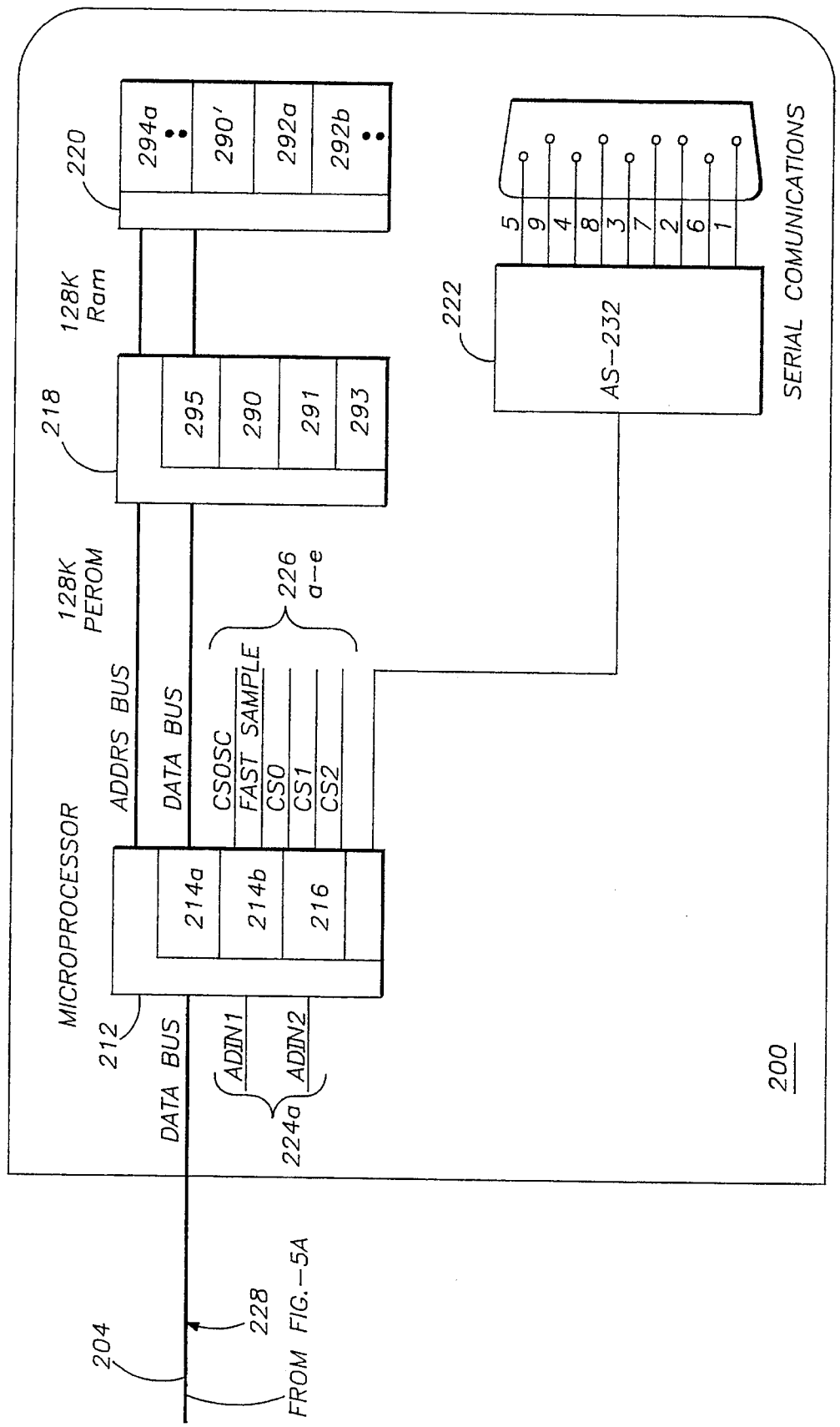

Referring to FIG. 5, there are shown additional details of the laser controller 200, the laser chip 170, the thermal compensation circuit 190 and the interface 202. The laser chip 170 is similar to existing laser chips and includes a laser diode 172, a back facet photo-detector (BFD) 174 coupled to the back facet of the laser diode 172, a thermistor 176 that monitors the temperature of the laser diode 172, and the thermo-electric cooler (TEC) 178. The laser diode 172 generates coherent light at its characteristic frequency when a forward-biasing voltage is placed across the nodes 181 and 185, which causes a laser current to flow in the diode 172 and stimulate the recombination of holes and electrons in the diode 172, releasing photons that form a standing light wave reflected between the diode's front and rear faces. Because the front face, or facet, of the diode 172 is less reflective than the rear face, most of the light that escapes from the diode 172 is emitted from the front facet to become the coherent light beam 171. The smaller amount of light emitted from the back facet of the diode 172 is detected by the BFD 174, which outputs a corresponding analog power signal 183 to the controller interface 202. Because the power in the back facet beam has a known proportional relationship to the power in the light beam 171, the light power of the light 171 can be derived from the power signal 183. In some cases back reflection of light from the lens 160 into the laser chip 170 causes variations or errors in the BFD 174 output. Therefore, it may be advantageous to split off a fraction of the power in the fiber 109 and monitor it with an external monitor 178b (FIG. 5). Other analog signals output from the laser 170 include (1) a laser temperature signal 187 from the thermistor 180 that indicates the temperature of the laser crystal 170 and (2) a thermal compensation current signal 189 that provides the feedback for the thermal compensation circuit 190. Each of these signals is directly input to one of the microprocessor's internal A/D converters 214 at the inputs 224a and 224b.

The laser controller 200 includes a microprocessor/timer 212, such as the MC68HC11 made by Motorola Inc, that performs general pump laser control, data handling and processing; read-only (ROM) and random access (RAM) memories 218 and 220, which store programs that are executed in the microprocessor 212 and pump laser performance data; and a serial interface 222, through which the controller 21 2 receives remote commands and transmits data, including pump laser failure and performance data. In a different embodiment, the controller 212 may reside in a remote location outside the amplifier 120 enclosure. The microprocessor 212 includes internal analog-to-digital (A/D) converters 214, an optional oscillator 216, analog inputs 224 coupled to the A/D converters 214, and digital outputs 226 that are used by the microprocessor 212 to control various components of the controller interface 202. The microprocessor 212 accesses information stored in the ROM 218 and the RAM 220 via conventional address and data busses.

This stored information includes the aforementioned beginning-of-life data 291, a controller program 290 and microprocessor housekeeping routines 293, such as a "boot routine" (i.e., the program executed by a microprocessor on initialization), all of which are stored in the ROM 218. The information stored in the RAM 220 includes multiple sets 292 of sampled laser data and corresponding characteristic data 294. For example, in the preferred embodiment, a data set 292a might include one hundred laser power, current and voltage samples and the data 294a the corresponding threshold, slope efficiency and dynamic resistance computed by the microprocessor 212. Additionally, at initialization, the RAM 220 is loaded by the microprocessor 212 under the control of the boot routine 293 with an executable version 290' of the controller program 290, which, once loaded and initialized, controls all operations of the controller 200 and, therethrough, the interface 202 and the laser 170.

The controller interface 202 includes several analog to digital converters 238, 244, 246 that sample and digitize the laser current, power and voltage, respectively, and transmit the digitized data to the controller 200 over the data bus 204. The interface 202 also includes several D/A converters 236, 240, 242 that translate digital outputs from the controller 200 into analog signals 241,243 that are applied to a transistor 260 hooked to the laser diode 172 to control its current and into an analog signal 237 that is input to the thermoelectric cooler (TEC) 178 (internal to the laser package) to control the laser's temperature under control of the thermal compensation circuit 190. As thermal compensation is performed in the conventional way, the remaining descriptions will solely address how the controller 200 via the controller interface 202 controls the laser 102 current and determines laser characteristics for failure prediction.

Modulation Control

As stated above, the controller 200 computes pump laser characteristics while indirectly modulating the injection current supplied to the laser diode 172 at a predefined modulation frequency F and fraction, or degree, A. i.e., during modulation, the laser diode 172 current I(t) is set to:

$$I(t)=I_{op}+A\sin 2\pi Ft,$$

where $I_{op}$ is the operational current level, which is continually adjusted by the controller 200 based on a fed back current signal 254. This modulation is accomplished by the controller 200 issuing signals over the data bus 204 that cause the interface 202 to modulate the signal 241' at the node 185, which in turn determines how much current will flow in the diode 172. The controller 200 can control the signal at the node 185 in one of two ways.

Figure 6:
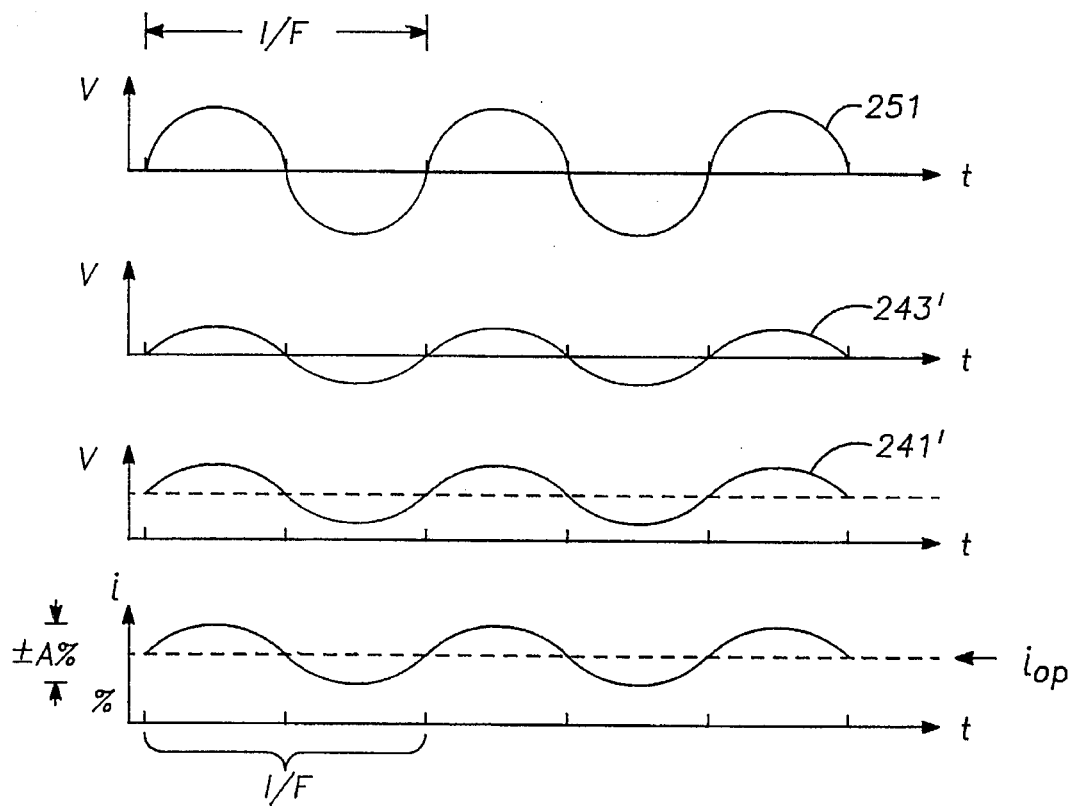
FIG. 6 is plot of the various signals that are used to modulate the injection current of the semiconductor laser 102 and of the resulting modulated injection current.

In a first embodiment shown in FIG. 5, the microprocessor 212 initiates a modulation operation by asserting the CSOSC (control signal—oscillator) signal 226a, which triggers the external oscillator 250 to generate an oscillating signal 251 at the desired modulation frequency F (note: the oscillator 250 continues to operate until the microprocessor deasserts the CSOSC signal). To adjust the amplitude of the oscillating signal 251 to the correct level (i.e., to ensure that the laser current will have the desired degree of modulation A) the microprocessor 212 places a digital amplitude adjustment value on the data bus 214 and then asserts the CS1 signal 226d, which triggers the D/A converter 242 to output a corresponding analog amplitude adjustment value 243. The two signals 251 and 243 are input to the amplifier 272, which multiplies the oscillating signal 251 by a gain that is a function of the adjustment value 243, resulting in an adjusted oscillating signal 243' with the desired amplitude. The signal 243' has the appropriate modulation characteristics (i.e., amplitude and period), but still needs to have added to it a current control offset that will guarantee that the laser current in the diode 172 will be modulated around the appropriate operational current level $I_{op}$. To do this, the microprocessor 212 places the appropriate digital current control offset on the data bus 204 and then asserts the CSO control signal 226c, which triggers the D/A converter 240 to convert the signal on the data bus to an analog current control offset 241. The offset 241 and the adjusted oscillating signal 243' are then combined by the amplifier 274 into a modulated control signal 241', which is used to drive the base of the transistor 260, whose collector current is thereby modulated in response to the control signal 241'. Typical forms of the various signals 251,243' and 241' and the resulting laser current drawn by the transistor 260 are shown in FIG. 6.

During this modulation process, the controller 200 periodically monitors the laser power, current and voltage. As the first step in this monitoring process, the controller 200 activates the FAST SAMPLE signal 226b, which causes the three A/D converters 238, 244, 246 to simultaneously sample and digitize the analog laser current, power and voltage signals 254, 255,256. In the preferred embodiment shown in FIG. 5, the analog current signal 254 is related to the voltage drop across a calibrated resistor 262, and the analog voltage signal 256 to the voltage drop across the laser diode 172. The analog power signal 255 is simply a buffered version of the light power value 183 output by the back facet detector 174. Once ready, the three digitized values are placed on the data bus 204 by the respective D/A converters in response to control signals placed by the microprocessor on the data bus 204. As described below, upon receiving these values, the microprocessor 212 computes the laser's health characteristics and also determines, based on the fed back current value, whether the laser diode current should be adjusted to a new value.

The modulation of the pump laser current does not have to go on continuously but may be applied for a short period during which the laser output is sampled. The laser current modulation may be sinusoidal or a triangular function of time. The sinusoidal modulation is preferred though because it does not generate any harmonics at other frequencies that might interfere with other device operations. As shown in FIG. 5, one preferred approach is to sample the laser current, laser voltage and laser output power simultaneously with the three A/D converters 238, 244, 246 in response to the FAST SAMPLE signal 226b. This sampling can then be done at randomly occurring times.

Figure 7:
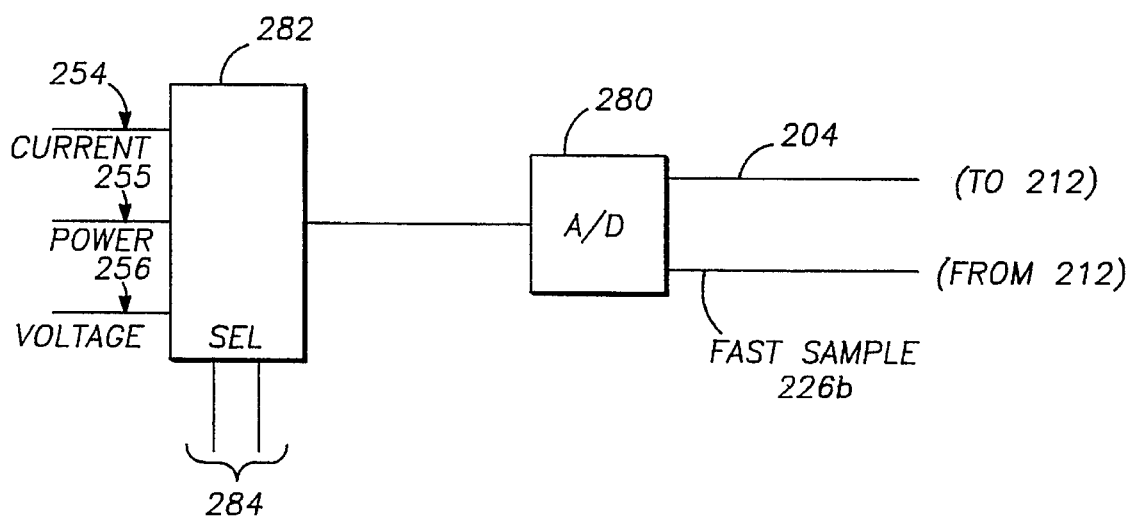
FIG. 7 is a block diagram of an alternative embodiment for sampling operational parameters of the laser 102.

In a second approach to current monitoring, shown in FIG. 7, the three A/D converters 238, 244, and 246 are combined into a single A/D converter 280 that is used on a time-shared basis to digitize the current, power and voltage signals 254, 255, 256. A multiplexer 282 controlled by the microprocessor 212 via selection signals 284 determines which analog signal is to be converted. The converted value is read out by the microprocessor 212 over the data bus 204 and stored in the RAM 220, then the microprocessor 212 resets the selection signal 284 to convert the next signal of the set (i.e., the microprocessor 212 causes a current, a power and a voltage to be converted in succession, but not necessarily in that order). Because these samples are not taken simultaneously, the A/D converter 280 must be extremely fast, and the microprocessor 212 must read the converted data with little delay. Given these timing-related limitations, the embodiment of FIG. 5 is preferred over that of FIG. 7. After reading the converted data over the data bus 204, all of the samples of light power, current and voltage are stored in the random access memory chip (RAM) 216 by the processor chip 212. When enough samples have been stored, the microprocessor 212 computes the laser threshold and other parameters of interest, stores the results in the memory 216 and compares the results to previous measurements (either beginning-of-life data stored in the ROM 220 or previous operational measurements stored in the RAM 218). If an increase in the laser threshold larger than a preselected value is observed, the processor 212 outputs an alarm over the communication port 218 incorporated in the electronic device controller 200. The controller 200 may also monitor the small irregularities in the laser output power known as kinks. Changes in the current at which such irregularities occur are also indicative of laser 170 degradation and can be used to further confirm or complement the degradation information provided by the change in threshold. Changes in slope efficiency (change in power per unit change in current, Watts/Amp) of the laser as well as changes in dynamic resistance of the laser (change in voltage per unit change in current, Volts/Amp or Ohm) can also be monitored to advantage and compared to the beginning-of-life data for the pump laser 102.

As an example, the threshold current of a 980 nm laser supplied by Lasertron Inc. of Massachusetts, is nominally 20 mA, the dynamic resistance 4 Ohms and the slope efficiency 0.75 W/A. Kinks in the output power occur at currents above 200 mA at beginning-of-life. Additional details on the beginning-of-life data for the Lasertron 980 nm laser were discussed in reference to FIG. 3. Having described the hardware employed by the present invention, we will now turn to a discussion of the methods by which the microprocessor 212 computes the laser's operation characteristics.

Computation of Laser Characteristics

In one embodiment the processor uses a simple linear extrapolation or regression to compute the threshold current from the values of current and power sampled in a region extending from 90% to 110% of the operating current value. Of course, any other region relative to the operating current could be used, right down to 0% of the operating current; however, too large current swings might disturb the laser 172.

An alternative preferred embodiment addresses the fact that the laser output is not strictly a linear function of current above threshold. In this embodiment, a digital model of the power output versus current is derived from measurements done at the beginning-of-life, and stored in memory. The model consists of a polynomial expansion of the power output such as:

$$P_{out} = S(I - \text{Threshold}) + B(I - I_{op})^2 + C(I - I_{op})^3 + \text{higher terms} \quad \text{(Eq. 1)}$$

In this expression, the coefficients S, Threshold, B, C, $I_{op}$ and the higher terms are derived from measurements of the laser currents and corresponding digitized laser power outputs as follows. The microprocessor 212 writes the digitized power outputs and corresponding laser currents to a table 295 in the RAM 218. After recording the powers and currents, the microprocessor 212 computes the difference between consecutive values of the power outputs and divides the power differences by the differences between the corresponding consecutive currents. A preset number of these computed ratios are then averaged by the microprocessor 212, which yields the slope or derivative of power versus current. This slope is the slope efficiency of the laser 170 and is also the first approximation of the coefficient S. Next, the microprocessor 212 computes the threshold current ("Threshold" in Eq. 1) by setting I=1$_{op}$ and the coefficient S to the slope efficiency just computed. The coefficients S, Threshold, B, C and higher coefficients (Eq. 1) are then computed according to a standard non-linear curve-fitting techniques such as the Levenberg-Marquardt non-linear least squares routine (for more information on this and other curve-fitting approaches, see "Numerical Recipes", Press et al., Cambridge University Press (1986)). As an optional step, this method is reiterated a number of times until the difference between the computed set of coefficients (e.g., threshold, S, B, C and higher terms) and the next computed set is smaller than a preset range (i.e., until the set of coefficients converges to a solution).

In an alternative embodiment, slope efficiency, threshold and the position of kinks are computed by fitting the multiple power and current samples to equation 2 by using by using non-linear least squares curve-fitting techniques in the same manner as described in reference to equation 1.

$$P_{out} = S(I - \text{Threshold}) + \sum_{i=2} B_i(I - I_{op})^i + \sum_k \frac{V_k(I - I_k)}{1 + \frac{(I - I_k)^2}{W_k}} \quad \text{(Eq. 2)}$$

In this expression, S represents slope efficiency as in equation 1; and the $B_i$ represent B, C and higher terms of equation 1. The additional term is used to fit the observed kinks (e.g., the kinks 132a–c in the curve 126 shown in FIG. 3). In this term, k is the number of kinks (e.g., in FIG. 3, k=3), the $W_k$ and the Vk are the widths and the amplitudes of the k observed kinks, and the Ik the currents at which the k kinks occur. As above, this method can be reiterated until the set of coefficients converges.

Dynamic resistance is calculated in the same way as slope efficiency in that differences in consecutive digitized voltages, also stored in the table 295, are divided by differences in the corresponding currents, then the computed ratios averaged.

In an alternative embodiment applicable to any of the methods described above for computing dynamic threshold and slope efficiency, after recording the powers/voltages and currents, the microprocessor 212 groups the powers/voltages and currents then computes group averages. For example, 100 power samples might be grouped in fours then 25 average powers computed. Consecutive ones of the group average values are then used in the remaining method steps exactly as the consecutive samples in the preferred embodiment described above. For example, one step of the alternative slope efficiency calculation would involve computing the differences between consecutive power averages (e.g., the 25 power averages) and dividing the differences by corresponding differences between consecutive current averages.

The microprocessor 212 also controls the timing of the periods during which the oscillating current modulation is applied to the laser and the sampling times of the A/D converters. How the microprocessor does this is now described.

METHOD OF THE PREFERRED EMBODIMENT

During operation of the pump laser 102, the processor 212 may perform the functions of controlling the pump laser temperature and current as well as monitoring other device parameters, managing alarms, and communicating with other system controllers over a network. All of these functions, as well as the modulation function described above, are performed by the processor 212 under the control of the program 290 stored in the ROM 218 and executing in the RAM 220.

Figure 8:
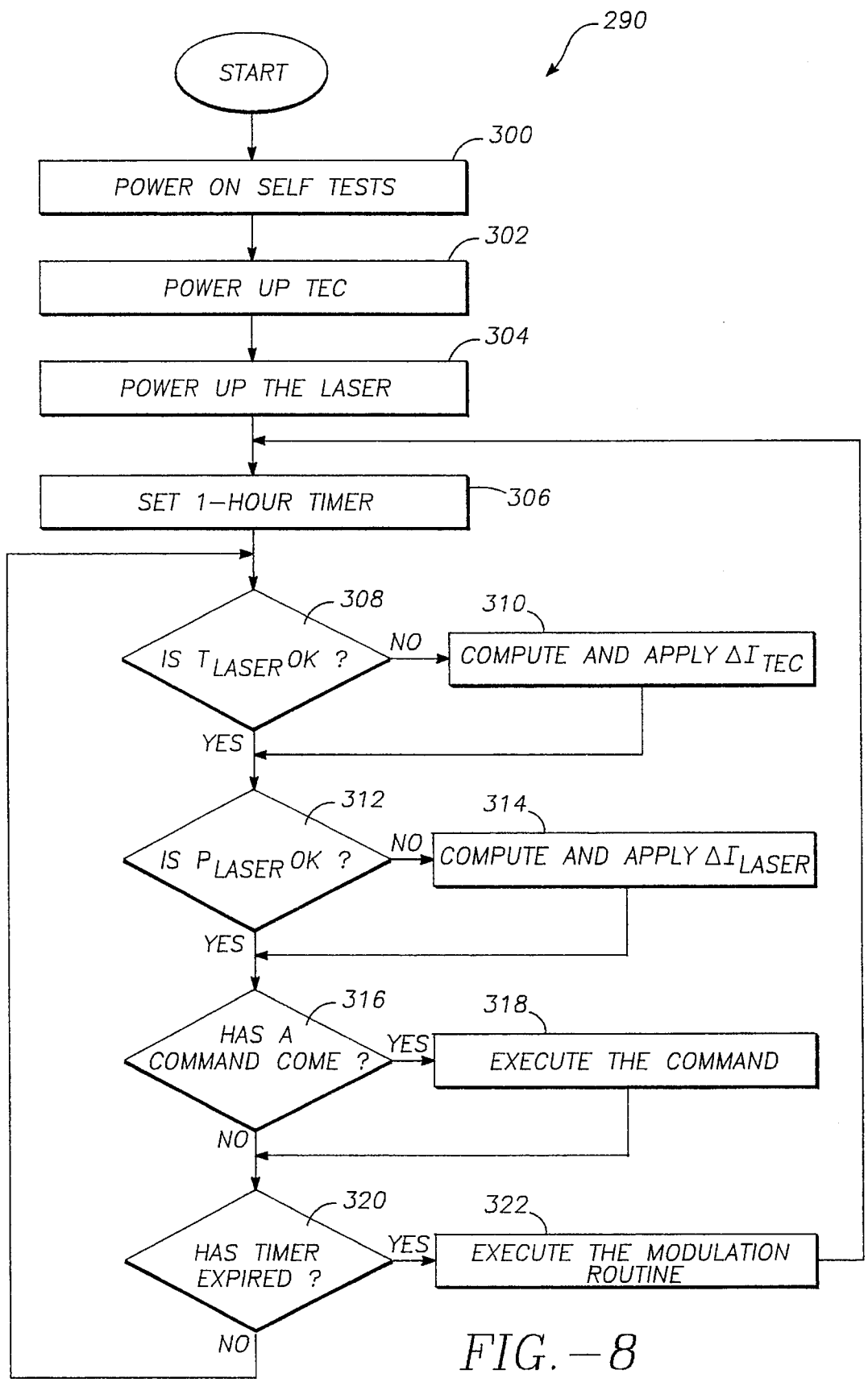
FIG. 8 is a flow chart of the computer program that executes in the microprocessor of FIG. 5.

Referring to FIG. 8, there is shown a flow diagram of the program 290 that executes in the microprocessor 212. Upon startup, the microprocessor 212 executes power on self tests (300), powers up the thermo-electric cooler (TEC) 178 that is integral to the laser 170(302), powers up the laser 170 (304), and sets a one hour timer that determines when the modulation routine is to be executed. After completing the startup steps, the microprocessor 212 begins a control loop that involves repeating the steps 308–322. As the first step in the control loop, the microprocessor 212 checks the ambient temperature of the laser 170 by measuring the analog output 187 of the thermistor 176. If the temperature is not in operating range (308-NO), the processor 212 energizes the thermoelectric cooler of the laser 170 to the right current to bring the laser chip to the desired temperature (310). The processor 212 then brings the laser up to the desired power output. The controller monitors the digitized value of the laser power by means of a photodetector and A/D converter. If the power output is different from the required value stored in memory (312-NO), the processor 212 brings the power up to the desired level according to one of four different methods (314).

In a first embodiment the microprocessor 212 computes the required change in laser current to bring the power to the required value and applies the needed current to the laser by controlling the base signal 241' of the current amplifying transistor 260 (314) as described above in reference to FIG. 5.

In a second embodiment the processor 212 increases the laser current to a preselected value and keeps it constant. As set out above, the actual laser currents are measured by passing the current through a calibrated resistor 262 and measuring the voltage drop across the resistor. This voltage drop, related to the laser current by a known multiplicative constant equal to the resistance, is digitized and compared in the processor 212 to a stored value. If the measured current is lower than the stored value the processor 212 calculates the required increment in output to be applied to the laser to make the measured and stored current values equal.

In a third embodiment the processor 212, using one of the internal A/D converters 214, monitors the output of an amplifier (e.g., the active fiber 106) or laser pumped by the semiconductor laser 102. If the amplifier output is different from a value stored in the ROM 218, the processor 212 computes the required current to apply to the laser 102 to bring the output power into a state of equality with the stored value.

In a fourth embodiment the processor 212, using two of the internal A/D converters 214, monitors the gain of an amplifier (e.g., the amplifier 106) or laser pumped by the semiconductor laser 102. If the amplifier gain is different from a value stored in the ROM 218, the processor 212 computes the required current to apply to the laser 102 to make the gain equal to the stored value. Next, if the controller 316 has received a command over the serial interface 222 (316), that command is executed by the microprocessor 212 (318). These commands include:

CONFIG, through which an operator can reconfigure the system 200 or program parameters such as for the control program 290;

VER, which causes the microprocessor 212 to return the S/W version;

HIST, which causes the microprocessor 212 to return data collected on the laser and stored in the RAM 220; and PWRDWN, which causes the microprocessor 212 to power down the laser 170.

Finally, the microprocessor tests whether a preset period of time T (for example one hour) has elapsed. If not, the program 290 repeats from step 306 (320-NO). If so, the modulation routine 322 is executed (320-YES), the steps of which are shown in FIG. 9.

Figure 9:
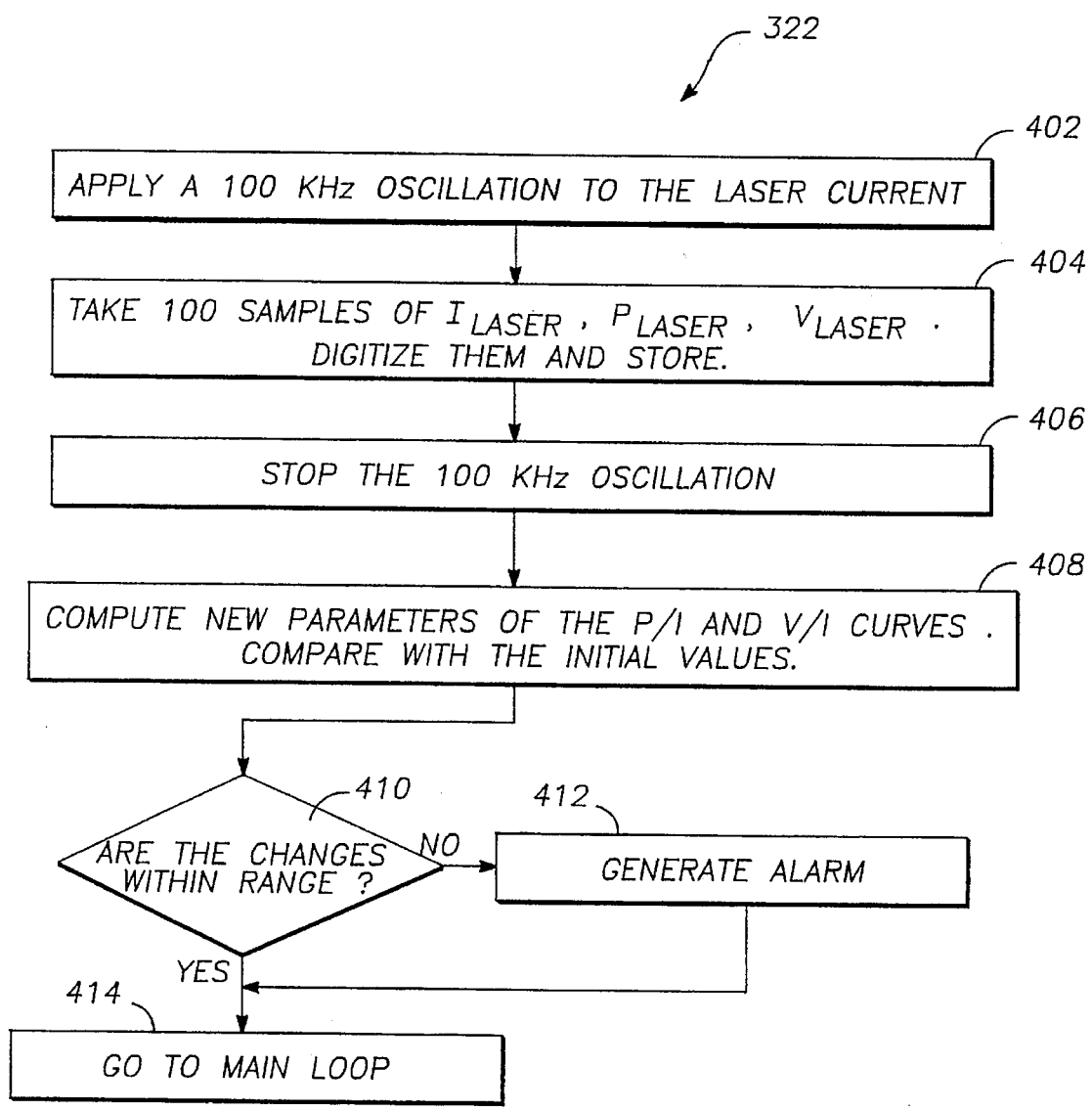
FIG. 9 is a flow chart expanding the modulation routine of the computer program of FIG. 8.

Referring to FIG. 9, as the first step of the modulation routine, the microprocessor 212 turns on the oscillator 250 to a preset frequency F (e.g., 100 kHz) and triggers the fast A/D converters 238, 244, 246 to sample and digitize the laser output, voltage and current at intervals t that are larger than but not a multiple of the oscillator period P (404). This ensures that the current is sampled at different locations within its period of oscillation. For example, if P is 10 microsecs, then t might be slightly smaller than one millisecond. Each set of current, power and voltage samples are stored by the microprocessor 212 in the RAM 220 (404). After enough of the samples are stored to allow the laser characteristics (i.e., threshold, slope efficiency and dynamic resistance) to be computed the microprocessor 212 stops the oscillation (406). As the preferred embodiment uses 100 samples, assuming a sampling period t of around 1 msec, this entire sampling process will take about 100 msec. Once the samples are stored in the RAM 220, the microprocessor 212 computes the corresponding threshold, slope efficiency and dynamic resistance of the laser 170 and compares those values to the beginning-of-life data 291 stored in the ROM 218 (408). If the changes are within an acceptable range (410-YES), the microprocessor 212 returns to step 306 of the main program loop, where the timer is reset. If the changes are out of range (410-NO), the microprocessor generates an alarm 412 and then returns to the main loop.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. In a system comprising a semiconductor laser, an apparatus to predict failure of said semiconductor laser, said semiconductor laser being characterized by at least one of a current threshold, a slope efficiency and a dynamic resistance and outputting a light beam, the power in said light beam being a function of injection current input to said laser, said apparatus comprising:

a photodetector configured to detect said power and output a corresponding power signal;

a modulating circuit configured to modulate said injection current with a predetermined modulation frequency and degree, said modulation frequency being selected so that operation of said system is not substantially disturbed by modulation in said power related to said modulated injection current; and a processing circuit coupled to said photodetector and said laser for sampling said injection current and at least one of a laser voltage signal and said power signal while said modulating circuit modulates said injection current, the resulting samples forming a sample set;

said processing circuit being configured to extract from a multiplicity of said sample sets an updated laser characteristic which is a function of at least one of said current threshold, slope efficiency and dynamic resistance.

2. In an optical amplifier configured to generate an amplified version of an input light signal using power in a pump light beam generated by a pump laser, an apparatus to predict failure of said pump laser, said apparatus consisting of:

a laser chip within said pump laser configured to output a first beam that becomes said pump light beam, said laser chip being characterized by a current threshold, a slope efficiency and a dynamic resistance, said laser chip outputting laser power, voltage and current signals while operating, the output power of said laser chip being controlled by said current signal;

a computer coupled to said laser chip configured to control said current signal and receive said laser power, current and voltage signals; said computer characterizing said pump laser by (1) causing the modulation of said current signal with a predetermined modulation frequency and degree about a desired operational current level, said modulation frequency being selected so that said amplified version is not substantially disturbed by said current modulation, (2) receiving multiple sets of said laser power, current and voltage signals while causing said current modulation, and (3) computing from said multiple sets an updated pump laser characteristic which is a function of at least one of said current threshold, slope efficiency and dynamic resistance.

3. The apparatus of claim 2, further comprising:

a controller interface coupling said laser chip and said computer, said controller interface including:

a plurality of analog to digital converters configured to sample said analog current, power and voltage signals from said laser chip and convert said samples to corresponding digital power, current and voltage signals that are output to said computer, said analog to digital converters sampling said signals upon receiving a FAST SAMPLE signal from said computer;

a plurality of digital to analog converters for receiving digital current control data from said computer and converting said digital current control data to analog current control data used to form a current control signal; and a current control transistor with a base coupled to said current control signal and a collector coupled directly to said laser, so that said laser's injection current mirrors said transistor's collector current;

such that said computer controls said injection current by controlling said current control signal.

4. The apparatus of claim 3, wherein said computer comprises:

a microprocessor configured to execute a control program, said microprocessor providing under control of said control program data and control signals to said digital to analog converters (DACs) and to said analog to digital converters (ADCs), said control signals including said FAST SAMPLE signal and said data including said digital current control data, said microprocessor computing under control of said control program said updated pump laser characteristic from said multiple sets of said power, current and voltage signals;

a RAM in which said microprocessor stores said multiple sets and in which said control program is stored while being executed by said microprocessor;

a ROM in which beginning-of-life data for said laser and said control program are permanently stored; and a serial interface for outputting laser characteristic data, including alarms when said laser is failing, and for receiving commands to be executed by said computer.

5. The apparatus of claim 3, wherein said controller interface further comprises:

an oscillator configured to output an oscillatory signal with an amplitude and an oscillation period equaling said predetermined modulation period in response to one of said control signals from said computer;

a first amplifier configured to output an adjusted oscillatory signal by adjusting said amplitude of said oscillatory signal in response to an amplitude adjustment signal from a first one of said DACs, said amplitude adjustment signal corresponding to data included in said digital current control data received by said first DAC from said computer; and a second amplifier configured to output said current control signal by adding to said adjusted oscillatory signal a current control offset from a second one of said DACs, said current control offset corresponding to data included in said digital current control data received by said second DAC from said computer;

said current control offset being set by said computer to maintain modulated injection current at said desired operational current level and said amplitude modulation of said adjusted oscillatory signal being set by said computer to maintain said modulated injection current at said predetermined modulation degree.

6. A method for determining the health of a semiconductor laser comprising the steps of:

without disturbing operation of a system employing said semiconductor laser, modulating injection current of said laser with a predefined modulation period and degree around a desired operational current level;

during said modulating, sampling operational parameters of said semiconductor laser including output power, junction voltage and said injection current to form a sample set;

repeating said sampling step a predefined number of times, forming a multiplicity of sample sets; and from said multiplicity of sample sets, computing at least one operational health characteristic of said semiconductor laser which is a function of at least one of current threshold, slope efficiency, dynamic resistance and kinks.

7. The method of claim 6, further comprising the steps of:

comparing said at least one operational health characteristic to earlier health characteristics for said semiconductor laser; and if said at least one operational health characteristic is not within a preset range of said earlier health characteristics, setting an alarm indicating that said semiconductor laser is failing.

8. The method of claim 6, wherein said modulating step comprises modulating said injection current of said semiconductor laser with said modulation period that is substantially shorter than the relaxation time of excited ions employed in a solid state laser or optical amplifier pumped by said semiconductor laser.

9. The method of claim 8, wherein said modulation period is no greater than one-third of said relaxation time.

10. The method of claim 6, wherein said modulation step comprises:

providing an oscillatory signal with an amplitude and an oscillation period equaling said predefined modulation period;

providing an adjusted oscillatory signal by adjusting said amplitude of said oscillatory signal;

providing a current control signal by adding to said adjusted oscillatory signal a current control offset;

outputting said current control signal to a laser modulation driver coupled to said laser so that so that said laser modulation driver controls said injection current in response to said current control signal;

setting said current control offset to maintain modulated injection current at said desired operational current level; and setting said amplitude modulation of said adjusted oscillatory signal to maintain said modulated injection current at said predefined modulation degree.

11. The method of claim 6, wherein said sampling step occurs randomly.

12. The method of claim 6, wherein said sampling step occurs at predefined sampling increments that are longer than and not multiples of said modulation period.

13. The method of claim 6, where said operational parameters are sampled simultaneously.

14. The method of claim 6, wherein said current threshold is computed by:

selecting corresponding power and current samples from said multiplicity of sample sets and linearly extrapolating from said power and current samples said threshold current.

15. The method of claim 6, wherein said slope efficiency is computed by:

computing a plurality of power differences consisting of differences between consecutive ones of said power samples;

computing a set of current differences consisting of differences between consecutive ones of said current samples;

computing a plurality of power-current ratios by dividing said power differences by said corresponding ones of said current differences; and averaging a preset number of said power-current ratios to provide said slope efficiency.

16. The method of claim 15, further comprising the step of:

before said first computing step, averaging groups of consecutive ones of said power samples and current samples to provide, respectively, a plurality of power sample averages and current sample averages; wherein said consecutive ones of said current samples are selected from said current sample averages and said consecutive ones of said power samples are selected from said power sample averages.

17. The method of claim 6, wherein said dynamic resistance is computed by:

computing a plurality of voltage differences consisting of differences between consecutive ones of said voltage samples;

computing a set of current differences consisting of differences between consecutive ones of said current samples;

computing a plurality of voltage-current ratios by dividing said voltage differences by said corresponding ones of said current differences; and averaging a preset number of said voltage-current ratios to provide said dynamic resistance.

18. The method of claim 17, further comprising the step of:

before said first computing step, averaging groups of consecutive ones of said voltage samples and current samples to provide, respectively, a plurality of voltage sample averages and current sample averages; wherein said consecutive ones of said current samples are selected from said current sample averages and said consecutive ones of said voltage samples are selected from said voltage sample averages.

19. The method of claim 6, wherein said current threshold is computed by:

computing a first approximation of said slope efficiency from said multiplicity of sample sets;

in the expression:

$$P_{out} = S(I - \text{Threshold}) + B(I - I_{op})^2 + C(I - I_{op})^3 + \text{higher terms},$$

setting the coefficient S equal to said first approximation of said slope efficiency and setting current I equal to an operational current $I_{op}$ at which said multiplicity of sample sets were measured;

solving said expression for said threshold current ("Threshold"); and computing the coefficients S, Threshold, B, C and higher terms by using non-linear curve fitting techniques and said multiplicity of sample sets, wherein the value $P_{out}$ is said output power, the coefficient S represents said slope efficiency, and the coefficients B, C and higher terms are curve-fitting coefficients.

20. The method of claim 19, wherein said method is reiterated a number of times until the difference between a computed set of coefficients threshold, S, B, C and the next computed set is smaller than a preset range.

21. The method of claim 6 wherein said current threshold and slope efficiency are computed by fitting said multiplicity of sample sets of power ($P_{out}$) and operational current ($I_{op}$) to the expression:

$$P_{out} = S(I - \text{Threshold}) + \sum_{i=2} B_i(I - I_{op})^i + \sum_k \frac{V_k(I - I_k)}{1 + \frac{(I - I_k)^2}{W_k}}$$

by using non-linear least squares curve-fitting techniques, wherein the variable I represents current, the coefficient S represents said slope efficiency, the coefficient Threshold represents said current threshold, the coefficients $B_i$ are curve-fitting coefficients of order i, the value k is the number of said kinks in the slope efficiency curve of said semiconductor laser, the values $W_k$ and $V_k$ are respectively the width and the amplitude of a kth observed kink, and the value $I_k$ is the current at which said kth observed kink occurs.

* * * * *